United States Patent [19]

Sezi et al.

[11] Patent Number: 5,262,283

[45] Date of Patent: * Nov. 16, 1993

[54] METHOD FOR PRODUCING A RESIST STRUCTURE

[75] Inventors: Recai Sezi, Röttenbach; Horst Borndörfer, Erlangen; Eva Rissel, Forchheim; Rainer Leuschner, Erlangen; Michael Sebald, Hessdorf-Hannberg; Hellmut Ahne, Röttenbach; Siegfried Birkle, Höchstadt A/Aisch, all of Fed. Rep. of Germany

[73] Assignee: Siemens Aktiegesellschaft, Munich, Fed. Rep. of Germany

[*] Notice: The portion of the term of this patent subsequent to Jul. 20, 2010 has been disclaimed.

[21] Appl. No.: 692,364

[22] Filed: Apr. 26, 1991

[30] Foreign Application Priority Data

Apr. 27, 1990 [EP] European Pat. Off. .......... 90108062

[51] Int. Cl.$^5$ ................ G03C 5/56; G03F 7/36
[52] U.S. Cl. .................. 430/375; 430/326; 430/328; 430/330; 430/323; 430/313; 156/643
[58] Field of Search ............... 430/326, 328, 330, 323, 430/325, 313; 156/643

[56] References Cited

U.S. PATENT DOCUMENTS

| | | | |
|---|---|---|---|
| 4,491,628 | 1/1985 | Ito et al. | 430/176 |
| 4,551,418 | 11/1985 | Hult et al. | 430/325 |
| 4,552,833 | 11/1985 | Ito et al. | 430/325 |
| 4,657,845 | 4/1987 | Frechet et al. | 430/326 |
| 4,775,609 | 10/1988 | McFarland | 430/325 |
| 4,810,601 | 3/1989 | Allen et al. | 430/18 |
| 4,810,613 | 3/1989 | Osuch et al. | 430/192 |
| 4,837,124 | 6/1989 | Wu et al. | 430/270 |
| 4,939,070 | 7/1990 | Brunsvold et al. | 430/326 |

FOREIGN PATENT DOCUMENTS

| | | |
|---|---|---|
| 0102450 | 3/1984 | European Pat. Off. . |
| 0161476 | 11/1985 | European Pat. Off. . |
| 0192078 | 8/1986 | European Pat. Off. . |
| 0229917 | 7/1987 | European Pat. Off. . |
| 0234327 | 9/1987 | European Pat. Off. . |
| 0251241 | 1/1988 | European Pat. Off. . |
| 0291994 | 11/1988 | European Pat. Off. . |
| 0292821 | 11/1988 | European Pat. Off. . |
| 0394740 | 10/1990 | European Pat. Off. . |

OTHER PUBLICATIONS

*Textbook of Polymer Science*, F. Billmeyer, John Wiley & Sons, N.Y., (1984) pp. 471–475.

SPIE's 1990 Symposium on Microlithography, Mar. 4–9 1990, San Jose, Calif., U.S.A.; Seminar Vol., p. 101.

Primary Examiner—Christopher D. RoDee
Attorney, Agent, or Firm—Kenyon & Kenyon

[57] ABSTRACT

High resolution resist structures with steep edges are obtained using standard equipment, with high sensitivity, particularly in the deep UV range. A photoresist layer consisting of a polymer having anhydride groups and blocked imide- or phenolic hydroxyl groups and of a photoactive component which forms a strong acid during irradiation is first deposited on a substrate, followed by irradiation with a patterned image. The irradiated photoresist layer is then treated with a water-based or a water-alcohol-based solution of a polyfunctional amino- or hydroxy-siloxane, and is etched in an oxygen-containing plasma.

20 Claims, No Drawings

METHOD FOR PRODUCING A RESIST STRUCTURE

Background of the Invention

The present invention relates to a method for producing high resolution resist structures with steep edges.

The production of resist structures plays an important role in microelectronics. For example photoresists are structured using photolithographic means in the manufacture of semiconductor components. One consequence of the recent advances in microelectronics, however, is an increase in the level of integration. Also, with smaller and smaller structures, increasing demands are placed on structure production. To meet these demands, greater resolution or higher contrast is required of the applied photoresists.

When photoresists are structured using photolithographic means, in addition to the technology- and resist-specific parameters, the properties of the stepper or the stepper lens used for irradiation also determine the minimum attainable structure size, critical dimension (CD), as well as the depth of focus (DOF). The stepper-specific variables, exposure wavelength $\lambda$ and lens numerical aperture (NA), are related to CD and the DOF as follows:

$CD = f_1 (\lambda/NA)$ and $DOF = \pm f_2 (\lambda/NA^2)$; wherein $f_1$ and $f_2$ are factors which are specific to the processing equipment.

For some time, the demands of photolithography have been satisfied by liquid-developable single-layer resists, particularly those consisting of novolak resins (as a base polymer) and quinone diazides (as a photoactive component). Such resist systems, however, may be unable to meet future requirements. For example, when thick resists are processed using excimer laser steppers in the deep-ultra-violet (DUV) range, it may be impossible to produce relief structures having steep edges and dimensions of less than 0.5 $\mu$m. This is particularly true of graduated substrate topographies and highly reflective sub-layers. To produce very small structures, shorter exposure wavelengths and high numerical apertures are needed. Unfortunately, this reduces the range of the depth of focus, making it very difficult to use liquid-developable single-layer resists (with relatively thick resist layers and unavoidable fluctuations in layer thickness) when high resolution on graduated topographies is required. In addition, these systems are not suited for application as DUV resists, particularly due to the high self-absorption of novolak, for example, at 248 nm.

To eliminate the problems associated with the application of liquid-developable single-layer resists, so-called two-layer systems were developed. These systems, however, are more complicated. In the two-layer systems, a single thin upper layer is irradiated and structured (i.e., developed or chemically modified through treatment with an agent). The structure produced in the upper layer serves as a contact mask and is subsequently transferred to the lower layer(s). To structure the lower layer, UV-light provided by a flood exposure (i.e., irradiation without an overlay mask) can be used in conjunction with liquid-development or with dry-development techniques such as reactive ion etching in an oxygen plasma ($O_2$/RIE).

Dry-developable single-layer systems have the advantages of the two-layer systems, while being less complex. In these systems, a latent image is produced through the irradiation of the surface of a resist layer that has been deposited on the substrate. The resist is then treated with a metal-containing organic reagent (e.g., an organosilicon compound) whereby, depending on the type of process control desired, either only the exposed areas (negative resist) or only the unexposed areas (positive resist) react with the reagent. The non-silylated areas are then dry-developed by etching in an oxygen plasma.

One problem with DUV lithography is that the sensitivity of resists containing quinone diazides or aliphatic diazoketones as photoactive components is low and does not meet production demands. To increase sensitivity, particularly in DUV lithography, systems have been developed which work according to the so-called "chemical amplification principle". These systems are applicable to both wet-developable resists and dry-developable resists. European Published Patent Application 0 102 450 is related to wet-development; European Published Patent Applications 0 161 476 and 0 229 917 are related to dry-development.

In contrast to conventional diazoketone/novolak systems, these systems consist, for example, of tertiary butoxycarbonyloxystyrol (as a base polymer) and of a so-called "photo-acid generator" (as a photoactive component). The photo-acid generator is a compound which forms a strong acid during exposure; the polarity of the base polymer also changes after exposure. Moreover, each acid molecule splits several protective groups. This fact is a characteristic feature of the chemical amplification and leads to high sensitivities. Additional possibilities of chemical amplification exist for systems besides those having Boc groups (Boc=tert-butoxycarbonyl). For example, one can also apply cleavable ethers as protective groups for acid-catalyzed splitting.

European Published Patent Application 0 161 476 discloses a resist consisting of tert-butoxycarbonyloxystyrol and a photoactive component in the form of triphenylsulphoniumhexafluoroarsenate. This resist is irradiated with UV light through an overlay mask and treated in a vacuum oven for one hour at 85° C. with gaseous hexamethyldisilazane (HMDS), thereby silylating the exposed areas of the resist surface. After reactive ion etching in an oxygen plasma and treatment with diluted, buffered hydrofluoric acid, highly resolved, negative structures with vertical edges are obtained. Trimethylsilylchloride and trimethyl-tin chloride are possible treatment reagents in addition to hexamethyldisilazane. The treatment reagents should be applicable in the gas phase or in a "suitable solvent". More detailed specifications, however, are not to be found.

European Published Patent Application 0 192 078 discloses a method for producing negative resist structures using a dry-developable resist system. First a base polymer containing a cationic photoinitiator, particularly a triarylsulphonium salt or a trihalogenated methyltriazine, is applied to a substrate. After exposure, the resist layer is treated with a cationically polymerizable monomer to form a polymer film. This film protects the exposed areas during the subsequent plasma etching. The treatment with the monomer is preferably conducted using an epoxysiloxane or -silane, or a styrolsilylether. These reagents can be applied in the gas phase or in solution.

A dry-developable negative resist system which works according to the chemical amplification principle is also known. Here, silylation with HMDS takes place after a Boc protective group is split (c.f., SPIE's 1990 *Symposium on Microlithography*, Mar. 4-9, 1990, San Jose, Calif.: Volume of Minutes, page 101). To produce positive resist structures, European Published Patent Application 0 229 917 discloses treating the exposed resist with a non-metalorganic compound in the form of an isocyanate. After a flood exposure (i.e., after an exposure without an overlay mask), the resist is treated with a metalorganic reagent in the form of a tin or silicon compound, such as HMDS. Finally, the resist is dry-developed (see also, European Published Patent Application 0 251 241).

The above-mentioned systems however, have the following disadvantages: use of moisture-sensitive, corrosive, poisonous or at the very least health-threatening gases or organic solvents; requirement for special vacuum apparatus; treatment at elevated temperatures; and complicated process control with difficult reproducibility.

European Published Patent Application 0 394 740 proposes a negative working, dry-developable resist system which, contrary to comparable systems, permits easy handling, features a high selectivity in the oxygen plasma, leads to highly resolved structures with steep edges, and finds application in existing customary apparatus. A characteristic feature of this system is that the resist is treated with a metal-containing organic reagent in an aqueous or water-containing, non-toxic phase, and it is implemented under ambient conditions (i.e., at room temperature and standard pressure). This resist system, which consists of a base polymer with reactive groups (e.g., a copolymer of styrol and maleic anhydride) and a photoactive component based on quinone diazide, works according to conventional principles. In other words, during irradiation, when a carboxylic acid is formed from the quinone diazide, only the polarity of the photoactive component is changed. For this reason the proposed resist system is relatively insensitive with currently available devices, particularly for applications in DUV lithography.

SUMMARY OF THE INVENTION

The present invention describes a method for producing high resolution resist structures with steep edges and a dry-developable resist system suited for this method.

Besides permitting ease of operation, the present invention has high oxygen plasma selectivity, is applicable to existing standard equipment, and has high sensitivity, particularly in the DUV range.

In the present invention, a photoresist layer comprising a polymer and a photoactive component are deposited on a substrate. The photoactive component is in the form of a compound which forms a strong acid during irradiation; the polymer contains anhydride groups and blocked imide or phenolic hydroxyl groups. This photoresist layer then is irradiated with a patterned image, followed by treatment with a water-based or a water-alcohol-based solution of a polyfunctional amino- or hydroxy-siloxane. The photoresist layer treated in this manner is then etched in an oxygen-containing plasma.

More specifically, the present invention, which works according to the chemical amplification principle, generally comprises the following steps:

A resist consisting of a base polymer and a photoactive component is applied to a substrate, for example, a silicon wafer. The resist is typically applied in the form of a solution, which may contain additives, such as sensitizers. The base polymer contains chemically reactive groups in the form of anhydride groups, but it is nevertheless stable in storage. Compounds which form a strong acid during irradiation serve as photoactive components; onium salts and halogen-containing triazine derivatives are preferable compounds.

In addition to the anhydride groups, the base polymer contains blocked functional groups, specifically in the form of imide groups or phenolic —OH groups. A Boc group, for example, can be used to block (i.e., protect) these groups. However, phenolic -OH groups can also be protected or blocked by acid-cleavable ethers. It is believed that the acid produced from the photoactive component during irradiation catalytically splits the protective groups allowing the functional groups (i.e., imide- or phenolic OH groups) to be released. It is also believed that these functional groups then make it possible for the amino- or hydroxy-siloxane to be selectively incorporated, i.e., its diffusion into the photoresist layer and a reaction with the anhydride groups of the base polymer.

Suitable base polymers are, for example, copolymers of tert-butoxycarbonyloxystyrol and maleic anhydride or terpolymers of tert-butoxycarbonyloxystyrol, maleic anhydride and styrol. Acid-cleavable ethers of p-hydroxystyrol such as isopropyl- and tert-butyl-ethers also come under consideration as comonomers for maleic anhydride. Base polymers with blocked imide groups include terpolymers of maleic anhydride, styrol and maleinimide that is blocked, for example with a Boc protective group).

The method of the present invention can also be conducted by applying a polymer featuring only anhydride groups. In this case, additives having blocked functional groups (i.e., hydroxyl groups) are then added to the polymer. These additives, which produce -OH groups in the presence of acid (i.e., in the exposed areas), block the silylation of the anhydride groups in the unexposed areas. The blocked —OH groups can exist in the form of acetal-, ketal- or orthoester-groups The hydroxyl groups can also be phenolic —OH groups which are then blocked in the manner indicated above. For this purpose, tert-butoxyphenyl- and tert-butoxycarbonyloxyphenyl- groups can be used. Suitable polymers are, for example, copolymers of maleic anhydride and styrol. European Published Patent Application 0 394 740 specifies several other suited polymers.

After the resist solution is applied to the substrate, it is dried, followed by irradiation through an overlay mask. After the exposure, the resist layer is preferably subjected to a temperature treatment using standard equipment before it is treated with a solution of a polyfunctional amino- or hydroxy-siloxane. Such organosilicon compounds are preferably diaminosiloxanes. Suitable compounds are described in the European Published Patent Application 0 394 740. The organosilicon compounds are applied in form of solutions, i.e. as water-based solutions or water-alcohol-based solutions, wherein isopropanol is particularly suitable. After treatment with the organosilicon compound, dry development is conducted in an oxygen plasma ($O_2$/RIE).

The procedure described above produces negative resist structures. However, the method of the present invention can also be used to produce positive resist structures. For this purpose, after exposure or temperature treatment (i.e.. before treatment with the organosilicon compound), the photoresist layer is treated with a polyfunctional organic compound having functional groups that can chemically react with the anhydride groups of the polymer.

It is believed that treatment with the polyfunctional organic compound causes the base polymer to be blocked in the exposed areas. This treatment step is followed by a flood exposure. During subsequent treatment with the organosilicon compound, only the flood-exposed areas react. These are the only areas protected from the plasma etching. Before the flood exposure, the resist can be subjected to a temperature treatment where it is tempered for a short time (e.g. 90 seconds) at temperatures in the range of 100° C. (e.g., 110° C.). After the flood exposure, the resist is treated with the organosilicon compound, followed by plasma etching.

A polyfunctional, organic compound, which is preferably metal-free, may be used with the method of the present invention. This compound is a polyamine with at least two amino groups; aliphatic polyamines or even amines with aromatic partial structures are preferably used. Suitable polyfunctional amines are, for example, triethylene tetramine, tetraethylene pentamine, tris(2-aminoethyl)amine, N,N'-bis(3-aminopropyl)-1,2-ethylenediamine and 3-(aminomethyl)benzylamine. These compounds, which serve as cross-linking reagents, can be applied in the form of aqueous solutions.

In addition to single-layer systems, the invention can be applied in dry-development two-layer systems. In two-layer systems, the reactive resist is applied as a thin layer to a dry-etchable planarization layer which can be freely selected according to the requirements at hand. Generally, semiconductor material, metal, ceramic, or the like is used as a base, i.e., as a substrate.

DETAILED DESCRIPTION

The invention is explained in greater detail based on the following examples. The starting materials or treatment reagents that are used in the examples are:

Base polymer (1): A copolymer of maleic anhydride and 4-(tert-butoxycarbonyloxy)-styrol which is prepared through the radical polymerization of the two monomers. Azoisobutyric-acid nitrile is used as an initiator and an alkylmercaptan is used as a regulator.

Base polymer (2): A copolymer of maleic anhydride and 4-(tert-butoxycarbonyloxy)-stryol which is prepared through the radical polymerization of the two monomers using azoisobutyric-acid nitrile as an initiator (without regulator).

Base polymer (3): A copolymer of maleic anhydride and 4-(tert-butoxy)-styrol which is prepared through the radical polymerization of the two monomers. Azoisobutyric-acid nitrile is used as an initiator and an alkylmercaptan is used as a regulator.

Base polymer (4): A terpolymer of maleic anhydride, 4-(tert-butoxycarbonyloxy)-styrol and styrol, prepared through the radical polymerization of the three monomers with azoisobutyric-acid nitrile as an initiator and an alkylmercaptan as a regulator.

Base polymer (5): A copolymer of maleic anhydride and styrol, prepared through the radical polymerization of the two monomers with azoisobutyric-acid nitrile as an initiator and an alkylmercaptan as a regulator.

Photoactive component (1): A compound which forms a strong acid during exposure. Suitable acid producers include onium compounds known as crivello salts and triazine derivatives; bis [4-(diphenylsulphonium)-phenyl]-sulphide-bis hexafluoroantimonate is used.

Additive (1): A compound from which at least one hydroxyl group is liberated by means of a strong acid; 4-(tert-butoxycarbonyloxy)-diphenylmethane is used.

Silylation solution (1): A water-alcohol solution consisting of 4 parts by weight of diaminosiloxane, 82.3 parts by weight of isopropanol and 13.7 parts by weight of water. The diaminosiloxane is preferably an $\delta,\omega$—aminofunctional siloxane, particularly one with two terminal aminopropyl groups and 2 to 20 silicon atoms in the chain. A commercial product, Tegomer A-Si 2120 (firm Goldschmidt), is used.

Silylation solution (2): A water-alcohol solution comprising 2 parts by weight diaminosiloxane (Tegomer A-Si 2120), 78.4 parts by weight isopropanol and 19.6 parts by weight water.

Silylation solution (3): A water-alcohol solution comprising 1 part by weight diaminosiloxane (Tegomer A-Si 2120), 79.2 parts by weight isopropanol and 19.8 parts by weight water.

Cross-linking solution (1): An aqueous solution comprising 2 parts by weight of tris(2-aminoethyl)-amine and 98 parts by weight water.

EXAMPLE 1

A resist consisting of 17.1 parts by weight of base polymer (2), 0.9 parts by weight of photoactive component (1) and 82 parts by weight of cyclohexanone is centrifuged on to a silicon wafer (2500 rpm, 20 seconds). After drying at 100° C. for 60 seconds on a hot plate, the thickness of this resist layer is 1.1 $\mu$m. The resist is then contact-printed through an overlay mask with 15 mJ/cm$^2$ (unit MJB 3 / Karl Süss: $\lambda=250$ nm), tempered for 60 seconds at 110° C., treated for 30 seconds with silylation solution (1) and rinsed for 30 seconds with isopropanol. The silicon wafer is subsequently placed in a plasma-etching installation (Material Research Corporation, type MIE 720) and the resist dry-developed in an oxygen plasma (O$_2$/RIE: 2 mTorr gas pressure, 50 V bias voltage, with magnet). Negative structures with vertical edges are obtained with dimensions down to 0.3 $\mu$m.

EXAMPLE 2

The commercial positive resist TSMR 8900 (firm Tokyo Ohka Kogyo Co.) is centrifuged onto a silicon wafer (4000 rpm, 20 seconds) and dried for 5 min. at 90° C. The resist is then baked out for 35 minutes in a forced air oven at 240° C. After baking, the thickness of the resist is 1.3 $\mu$m it is used as a planarization layer.

A resist consisting of 15.2 parts by weight of base polymer (1), 0.8 parts by weight of photoactive component (1) and 84 parts by weight of cyclohexanone is centrifuged onto the planarization layer (4500 rpm, 20 seconds). After drying at 100° C. for 60 seconds on a hot plate, the layer thickness of this top resist is 440 nm. The resist is then contact-printed through an overlay mask with 13 mJ/cm$^2$ (unit MJB 3/ Karl Süss: $\lambda=250$ nm), tempered for 60 seconds at 110° C., treated for 30 seconds with silylation solution (1), and rinsed for 30 seconds with isopropanol. The silicon wafer is subsequently placed in a plasma-etching installation (Leybold Heraeus, type Z 401) and the resist dry-developed in an oxygen plasma (O$_2$/RIE: 6 mTorr gas pressure, 500 V bias voltage). Negative structures with vertical edges are obtained with a line space ratio of 1:1 and dimensions of down to 0.3 $\mu$m.

EXAMPLE 3

A resist consisting of 14.9 parts by weight of base polymer (3), 1.1 parts by weight of photoactive component (1), and 84 parts by weight of cyclohexanone is centrifuged onto a planarization layer according to example 2 (3000 rpm, 20 seconds). After drying at 100° C. for 60 seconds on a hot plate, the layer thickness of this top resist is 400 nm. The resist is then contact-printed through an overlay mask with 13 mJ/cm$^2$ (unit MJB 3/ Karl Süss: $\lambda$=250 nm), tempered for 60 seconds at 110° C., treated for 45 seconds with silylation solution (2), and rinsed for 30 seconds with isopropanol. After dry development (O$_2$/RIE: 2 mTorr gas pressure, 50 V bias voltage, with magnet) in a plasma-etching installation (Material Research Corporation, type MIE 720), well resolved negative structures with steep edges are obtained with dimensions of down to 0.3 $\mu$m.

EXAMPLE 4

A resist comprising 20.9 parts by weight of base polymer (4), 1.1 parts by weight of photoactive component (1), and 78 parts by weight of cyclohexanone is centrifuged on to a silicon wafer (3000 rpm, 20 seconds). After drying at 100° C. for 60 seconds on a hot plate, the layer thickness of this resist is 1.2 $\mu$m. The resist is then contact-printed through an overlay mask with 14 mJ/cm$^2$ (unit MJB 3/ Karl Süss: $\lambda$=250 nm), tempered for 75 seconds at 110° C., treated for 60 seconds with the silylation solution (3), and rinsed for 30 seconds with isopropanol. The silicon wafer is subsequently placed in a plasma-etching installation (Material Research Corporation, type MIE 720) and the resist dry-developed in an oxygen plasma (O$_2$/RIE: 2 mTorr gas pressure, 50 V bias voltage, with magnet). Negative structures with dimensions down to 0.35 $\mu$m are obtained with steep edges and a line/space ration of 1:1.

EXAMPLE 5

A resist according to Example 2 is deposited in the described manner onto the base, dried, contact-printed through an overlay mask with 8 mJ/cm$^2$ (unit MJB 3 / Karl Süss: $\lambda$=50 nm) and tempered for 75 seconds at 110° C. The resist layer is subsequently treated for 60 seconds with the cross-linking solution (1), rinsed for 30 seconds with water, and tempered for 90 seconds at 110° C. As a result of this process, the exposed areas are so severely cross-linked that no silylation of these areas takes place during subsequent treatment with the organosilicon compound.

After a DUV flood exposure (without overlay mask) of 12 mJ/cm$^2$, the resist is tempered for 30 seconds at 100° C., treated for 35 seconds with silylation solution (1), and rinsed for 30 seconds with isopropanol. It is subsequently dry-developed in a plasma-etching installation (Leybold Heraeus, type Z 401) with an oxygen plasma (O$_2$/RIE: 6 mTorr gas pressure, 450 V bias voltage). Positive structures are obtained with vertical edges and a line/space ratio of 1:1.

EXAMPLE 6

A resist consisting of 9.7 parts by weight of base polymer (5), 4.5 parts by weight of additive (1), 0.8 parts by weight of photoactive component (1), and 85 parts by weight of cyclohexanone is centrifuged onto a planarization layer according to Example 2 (4500 rpm, 20 seconds). After drying at 90° C. for 60 seconds on a hot plate, the layer thickness of this top resist is 300 nm. The resist is then contact-printed through an overlay mask with 16 mJ/cm$^2$ (unit MJB 3/ Karl Süss: $\lambda$=250 nm), tempered for 60 seconds at 110° C., treated for 30 seconds with the silylation solution (2), and rinsed for 30 seconds with isopropanol. After dry development (O$_2$/RIE: 6 mTorr gas pressure, 500 V bias voltage) in a plasma-etching installation (Leybold Heraeus, type Z 401), negative structures with vertical edges are obtained having dimensions down to 0.3 $\mu$m.

What is claimed is:

1. A method for producing high resolution resist structures with steep edges, comprising the steps of:
    applying to a substrate a photoresist layer comprising a polymer having anhydride groups and groups selected from the group consisting of blocked imide- and blocked phenolic hydroxyl groups, and a photoactive component which forms a strong acid during irradiation;
    irradiating the applied photoresist layer with a patterned image;
    treating the irradiated photoresist layer with a water-based or water-alcohol-based solution of a polyfunctional amino-siloxane or a polyfunctional hydroxy-siloxane; and
    etching the treated photoresist layer in an oxygen-containing plasma.

2. The method according to claim 1 further comprising the step of:
    subjecting the photoresist layer to an elevated temperature after the stem of irradiating the applied photoresist layer with a patterned image.

3. The method according to claim 5, wherein the photoactive component is selected from the group consisting of an onium salt and a halogen-containing triazine derivative.

4. The method according to claim 2, wherein after the step of subjecting the photoresist layer to a temperature treatment, the method further comprises the steps of:
    treating the photoresist layer with a polyfunctional organic compound having functional groups having a chemical reaction with the anhydride groups of the polymer in the irradiated areas; and
    exposing the photoresist layer to a flood exposure.

5. The method according to claim 4 further comprising the step of subjecting the photoresist layer to an elevated temperature before the step of exposing the photoresist layer to a flood exposure.

6. The method according to claim 1, wherein after the step of irradiating the applied photoresist layer with a patterned image, the method further comprises the steps of:
    treating the photoresist layer with a polyfunctional organic compound having functional groups having a chemical reaction with the anhydride groups of the polymer in the irradiated areas; and
    exposing the photoresist layer to a flood exposure.

7. The method according to claim 6 further comprising the step of subjecting the photoresist layer to an elevated temperature before the step of exposing the photoresist layer to a flood exposure.

8. The method according to claim 6, wherein the polyfunctional organic compound is a polyamine.

9. The method according to claim 8, wherein the polyamine is an aliphatic polyamine.

10. The method according to claim 1, wherein the substrate is a dry-etchable planarization layer.

11. A method for producing high resolution resist structures with steep edges, comprising the steps of:

applying to a substrate a photoresist layer comprising a polymer having anhydride groups, an additive to the polymer having blocked hydroxyl groups, and a photoactive component which forms a strong acid during irradiation;

irradiating the applied photoresist layer with a patterned image;

treating the irradiated photoresist layer with a solution of a polyfunctional amino-siloxane or a polyfunctional hydroxy-siloxane, the solution being based on a solvent selected from the group consisting of water and water-alcohol mixtures; and etching the treated photoresist layer in an oxygen-containing plasma.

12. The method according to claim 11 further comprising the step of:

subjecting the photoresist layer to an elevated temperature after the step of irradiating the applied photoresist layer with a patterned image.

13. The method according to claim 4, wherein the photoactive component is selected from the group consisting of an onium slat and a halogen-containing triazine derivative.

14. The method according to claim 12, wherein after the step of subjecting the photoresist layer to a temperature treatment, the method further comprises the steps of:

treating the photoresist layer with a polyfunctional organic compound having functional groups having a chemical reaction with the anhydride groups of the polymer in the irradiated areas; and exposing the photoresist layer to a flood exposure.

15. The method according to claim 14 further comprising the step of subjecting the photoresist layer to an elevated temperature before the step of exposing the photoresist layer to a flood exposure.

16. The method according to claim 11, wherein after the step of irradiating the applied photoresist layer with a patterned image, the method further comprises the steps of:

treating the photoresist layer with a polyfunctional organic compound having functional groups having a chemical reaction with the anhydride groups of the polymer in the irradiated areas; and exposing the photoresist layer to a flood exposure.

17. The method according to claim 16 further comprising the step of subjecting the photoresist layer to an elevated temperature before the step of exposing the photoresist layer to a flood exposure.

18. The method according to claim 16, wherein the polyfunctional organic compound is a polyamine.

19. The method according to claim 18, wherein the polyamine is an aliphatic polyamine.

20. The method according to claim 11, wherein the substrate is a dry-etchable planarization layer.

* * * * *